United States Patent
Ono et al.

(10) Patent No.: US 6,639,441 B2
(45) Date of Patent: Oct. 28, 2003

(54) CLOCK SIGNAL CORRECTION CIRCUIT AND SEMICONDUCTOR DEVICE IMPLEMENTING THE SAME

(75) Inventors: Masaaki Ono, Yamanashi (JP); Masataka Kazuno, Yamanashi (JP); Narito Matsuno, Hokkaido (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 10/046,186

(22) Filed: Jan. 16, 2002

(65) Prior Publication Data

US 2002/0097075 A1 Jul. 25, 2002

(30) Foreign Application Priority Data

Jan. 19, 2001 (JP) ........................................ 2001-011174

(51) Int. Cl.[7] .............................................. H03K 3/017
(52) U.S. Cl. .................... 327/175; 327/161; 327/176
(58) Field of Search .................... 327/172, 173–176, 327/115, 141, 155, 154, 161–163, 165; 331/40; 326/93

(56) References Cited

U.S. PATENT DOCUMENTS

| | | | | |
|---|---|---|---|---|
| 5,757,218 A | * | 5/1998 | Blum | ........................ 327/175 |
| 6,150,847 A | * | 11/2000 | Lu | ............................... 326/93 |
| 6,426,660 B1 | * | 7/2002 | Ho et al. | ..................... 327/175 |

FOREIGN PATENT DOCUMENTS

JP 2000-183700 6/2000

* cited by examiner

*Primary Examiner*—Minh Nguyen
(74) *Attorney, Agent, or Firm*—Armstrong, Westerman & Hattori, LLP

(57) ABSTRACT

A clock signal correction circuit which corrects duty cycle distortions of a clock signal in a simple and accurate way. A frequency divider divides the frequency of a given input clock signal by a natural number n, thereby producing a divided clock signal. The phase of this divided clock signal is identified by a phase detector. By adding an appropriate delay to the divided clock signal according to the identified signal phase, a delay unit produces a delayed divided clock signal. A logical operator creates an output clock signal by performing a logical operation on the original divided clock signal and the delayed divided clock signal.

12 Claims, 16 Drawing Sheets

CLOCK SIGNAL CORRECTION CIRCUIT AND SEMICONDUCTOR DEVICE IMPLEMENTING THE SAME

BACKGROUND OF THE INVENTION

1. Field of the Invention

The present invention relates to a clock signal correction circuit and a semiconductor device implementing the same. More particularly, the present invention relates to a clock signal correction circuit which corrects duty cycle distortions of clock signals, and to a semiconductor device on which such a duty cycle correction circuit is integrated.

2. Description of the Related Art

Clock signal correction circuits are used to correct duty cycle distortions of a clock signal. FIG. 16 shows a typical configuration of such circuits. The illustrated clock signal correction circuit is composed of a frequency divider 10, a delay element array 11, a selector 12, and an exclusive OR (XOR) array 13. The frequency divider 10 divides the frequency of a given input clock signal by two, producing a divider output signal. The delay element array 11 consists of a plurality of delay elements connected in series to give a small delay, τ per stage, to the divider output signal. The resulting signals, referred to as "delay output signals" C(1) to C(m), are supplied to the selector 12. These signals C(1) to C(m) are intended to subdivide one half-cycle period of the divider output signal equally into n sections, so that the selector 12 will send them to the XOR array 13 as "selector output signals" D(1) to D(m), enabling one of them. The XOR array 13 contains a plurality of XOR gates to perform an exclusive OR operation on the divider output signal and selector output signals D(1) to D(m).

To provide a clock signal with a desired duty ratio, the above conventional circuit operates as follows. The input clock signal is first directed to the frequency divider 10 to supply a half-rate divider output signal to the delay element array 11, selector 12, and XOR array 13. With its cascaded delay units, the delay element array 11 produces a plurality of delayed signals having successively larger delays with respect to the preceding signal. Such outputs of the delay elements are then supplied to the selector 12 as delay output signals C(1) to C(m). This means that one half cycle period of the divider output signal is evenly subdivided into n sections at fixed intervals of τ. While those signals C(1) to C(m) are sent to the XOR array 13 as the selector output signals D(1) to D(m), the selector 12 enables only a particular signal selected from among D(1) to D(m) as desired. The XOR array 13 performs an exclusive OR operation on the divider output signal and selector output signals D(1) to D(m). During the high-level period of the divider output signal, the resultant signal becomes low when the enabled selector output signal is high, and high when the enabled selector output signal is low.

The above-described clock signal correction circuit can give a desired duty cycle to the input clock signal according to which selector output signal to enable. Such a conventional circuit, however, is not accurate enough, and not suitable for integration into a small device.

SUMMARY OF THE INVENTION

In view of the foregoing, an object of the present invention is to provide a clock signal correction circuit which is simple enough to be integrated into a small device, besides providing a highly accurate duty ratio. It is another object of the invention to provide a semiconductor device which implements such a clock signal correction circuit.

To accomplish the above objects, according to one aspect of the present invention, there is provided a clock signal correction circuit which corrects duty cycle distortions of an input clock signal. This circuit comprises the following elements: a frequency divider which divides the frequency of the input clock signal by a natural number n, thereby producing a divided clock signal; a phase detector which identifies the phase of the divided clock signal; a delay unit which produces a delayed divided clock signal by adding a delay to the divided clock signal according to the identified phase of the divided clock signal; and a logical operator which produces an output clock signal by performing a logical operation on the divided clock signal and delayed divided clock signal.

Further, according to another aspect of the present invention, there is provided a clock signal correction circuit which corrects duty cycle distortions of an input clock signal. This circuit comprises the following elements: an input circuit which receives a clock signal; a correction circuit which corrects duty cycle distortions of the received clock signal; an output circuit which outputs the clock signal with a duty cycle that is corrected by the correction circuit; and a notification circuit which notifies other circuits that the duty cycle of the received clock signal has been corrected.

Moreover, according to yet another aspect of the present invention, there is provided a semiconductor device on which a clock signal correction circuit is integrated to correct duty cycle distortions of an input clock signal. This clock signal correction circuit comprises the following elements: a frequency divider which divides the frequency of the input clock signal by a natural number n, thereby producing a divided clock signal; a phase detector which identifies the phase of the divided clock signal; a delay unit which produces a delayed divided clock signal by adding a delay to the divided clock signal according to the identified phase of the divided clock signal; and a logical operator which produces an output clock signal by performing a logical operation on the divided clock signal and delayed divided clock signal.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Preferred embodiments of the present invention will be described below with reference to the accompanying drawings.

Figure 1:
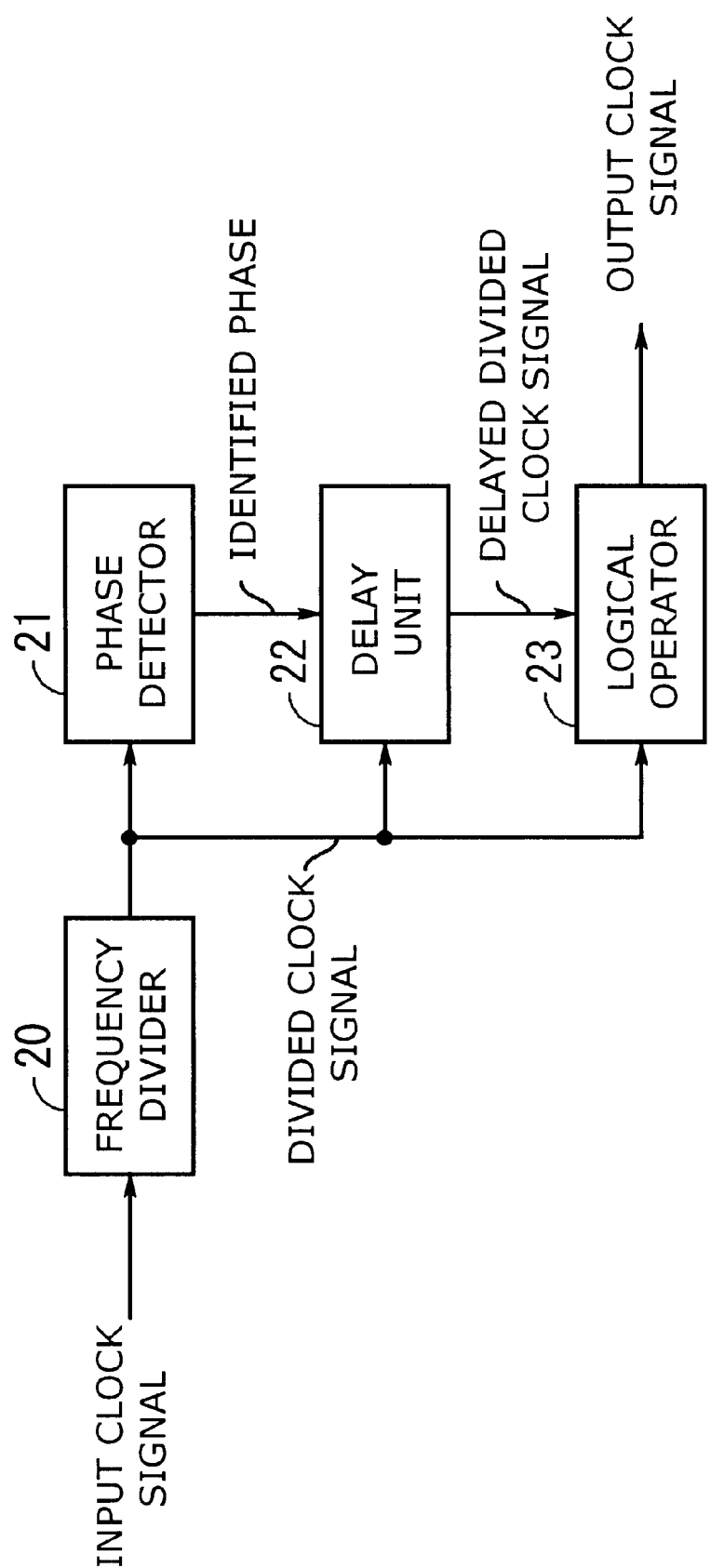
FIG. 1 is a conceptual view of a clock signal correction circuit according to the present invention.

FIG. 1 is a conceptual view of a clock signal correction circuit according to the present invention. The illustrated circuit has the following functional elements: a frequency divider 20, a phase detector 21, a delay unit 22, and a logical operator 23. The frequency divider 20 divides the frequency of a given input clock signal by n (n: natural number), thereby producing a divided clock signal. Here, the term "natural number" refers to any positive integer, not including zero.

The phase detector 21 identifies the phase of the divided clock signal. The delay unit 22 delays the divided clock signal according to the identified clock phase, thereby producing a delayed divided clock signal. The logical operator 23 produces an output clock signal by applying a logical operation on the divided clock signal and delayed divided clock signal.

Figure 2:
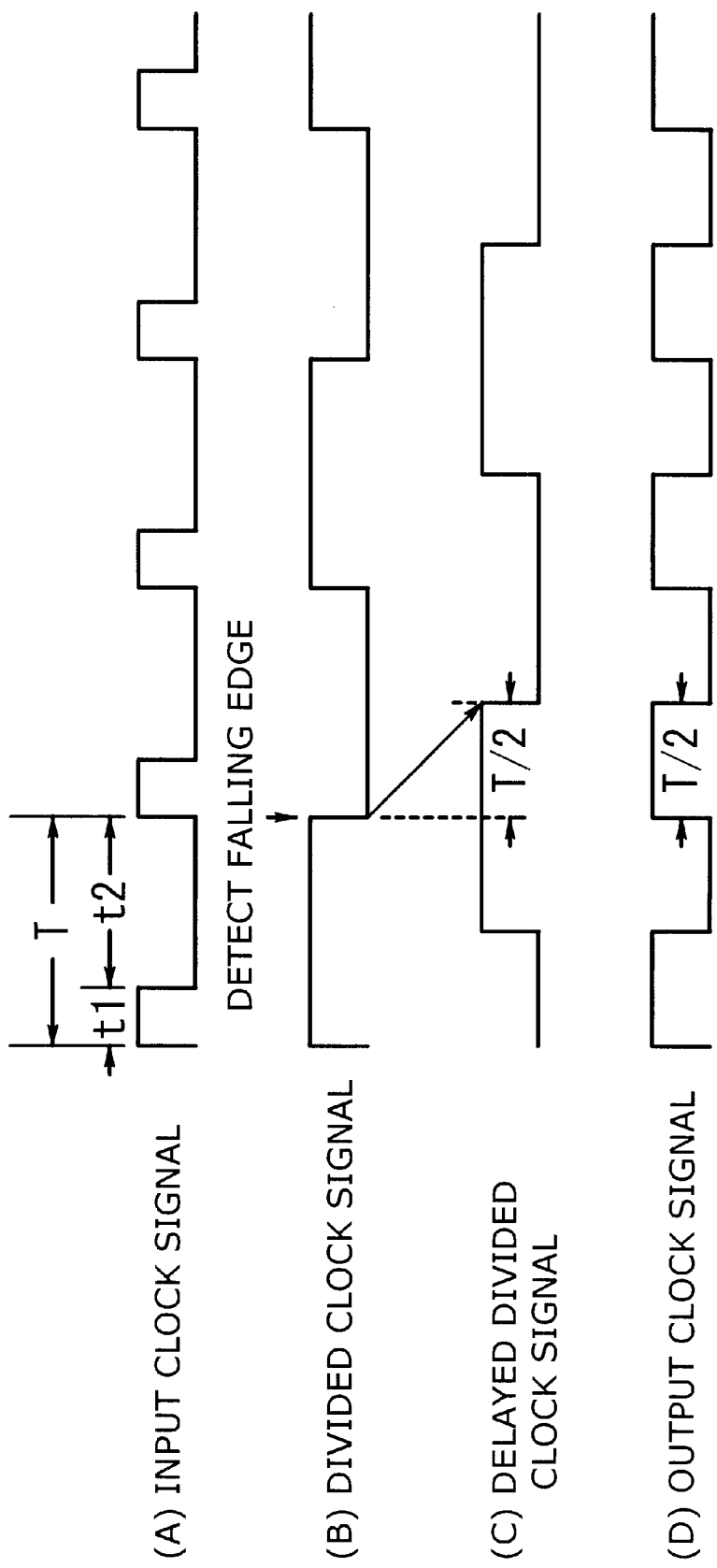
FIG. 2 is a timing diagram which shows the operation of the clock signal correction circuit of FIG. 1.

For illustrative purposes, it is assumed in FIG. 2 and subsequent drawings that the frequency divider 20 is configured to divide its input signal by two (i.e., n=2). With n=2, the above clock signal correction circuit will operate as shown in the timing diagram of FIG. 2.

FIG. 2 shows four signals in the main part of the clock signal correction circuit of FIG. 1. Referring to part (A), the input clock signal has a cycle time of T, with high time t1 and low time t2, where t2 is greater than t1. The frequency divider 20 divides such an input clock signal into a half-rate signal as shown in part (B) of FIG. 2. This signal, named the divided clock signal, has a cycle time of 2T.

The phase detector 21 identifies the phase of the divided clock signal by measuring its falling edge position. The clock phase information (i.e., the falling edge position) is then supplied to the delay unit 22. With this information, the delay unit 22 chooses an appropriate delay to yield a delayed divided clock signal shown in part (C) of FIG. 2. In the present example, the delayed divided clock signal (C) has a delay time of T/2 relative to the original divided clock signal (B).

More specifically, the phase detector 21 checks whether the divided clock signal is high or low at the rising edge of a signal that has a certain delay time with respect to the original divided clock signal. Repeating the same with an incremental delay time, the phase detector 21 identifies a particular point in clock phase at which the falling edge of the divided clock signal is observed. The phase detector 21 now informs the delay unit 22 of the delay time at that point, which must be equal to the cycle time T of the original input clock signal. The delay unit 22 then configures itself with a delay time that is equivalent to one half of the informed delay time T, thereby giving a half-cycle delay to the divided clock signal. This results in a delayed divided clock signal shown in part (C) of FIG. 2.

The logical operator 23 performs an exclusive OR operation between the original divided clock signal (B) and delayed divided clock signal (C). The resultant output signal is shown in part (D) of FIG. 2. Recall that the delayed divided clock signal (C) is delayed by T/2. This half-cycle delay enables the resulting output clock signal (D) to have a duty ratio of 1:1 (or 50 percent).

The above embodiment of the present invention corrects duty cycle distortions of a given input clock signal by: (a) identifying the phase of a divided clock signal that is produced by dividing a given input clock signal by two, (b) creating a delayed divided clock signal by giving a half-cycle delay to the divided clock signal with reference to the identified phase, and (c) producing an output clock signal by performing an XOR operation on the delayed divided clock signal and the original divided clock signal. The cycle time of the input clock signal is measured by identifying the phase of the divided clock signal, and an exact half-cycle delay is produced from the measured cycle time. For this reason, the duty cycle can be corrected accurately and effectively.

While the above explanation of FIG. 1 has assumed that the frequency divider 20 divides the frequency of its input signal by two, the present invention should not be limited to that specific factor. The frequency divider 20 may also be configured to divide the input frequency by any other numbers. In the latter case, the clock signal correction circuit would be able to convert the cycle time of an input clock signal.

Further, the delay unit 22 could produce any amount of delay, not limited to one half-cycle period, for shifting the divided clock signal. By configuring the delay unit 22 in this way, it would be possible to gain any desired duty cycle other than 50 percent.

Figure 3:
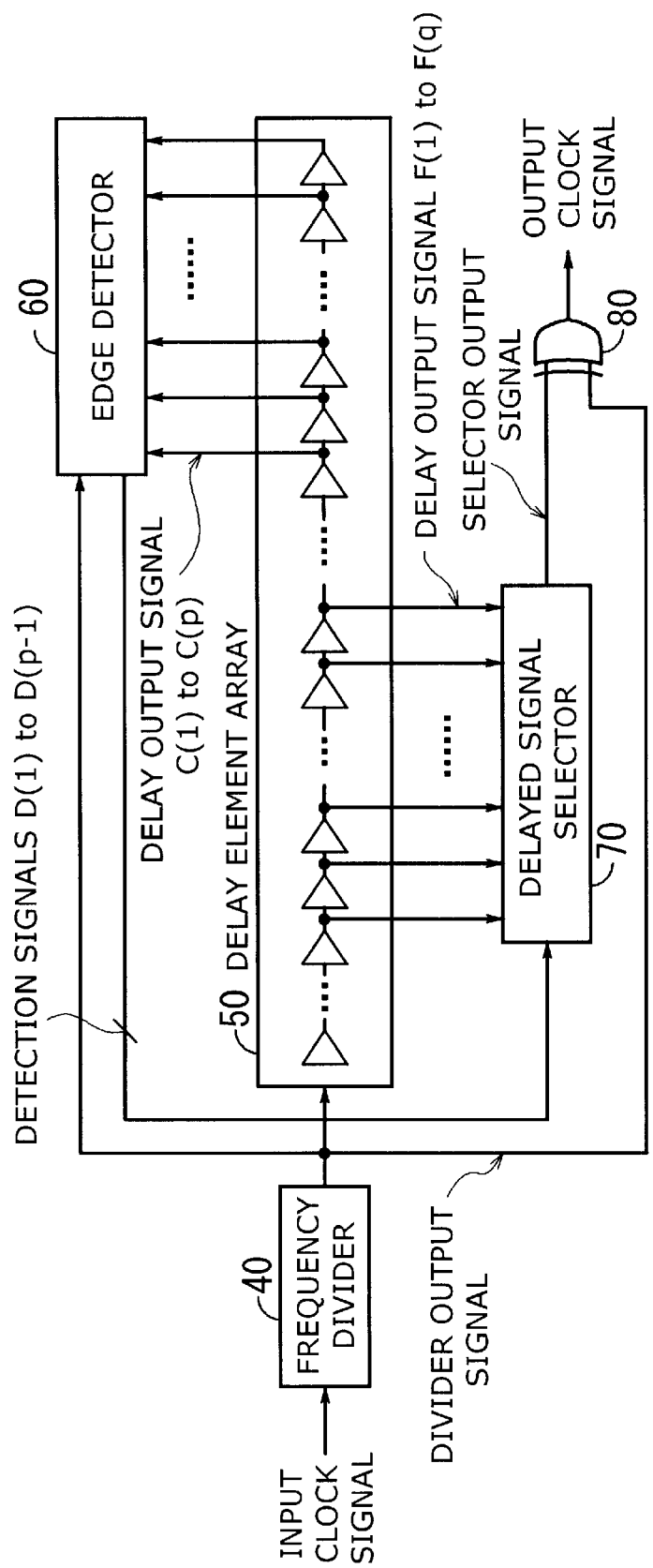
FIG. 3 is a block diagram of a first embodiment of the present invention.

Referring next to FIGS. 3 to 9, a more specific implementation of the present invention will be described. FIG. 3 is a block diagram of a clock signal correction circuit according to a first embodiment of the present invention. The illustrated circuit has a frequency divider 40, a delay element array 50, an edge detector 60, a delayed signal selector 70, an XOR gate 80.

The frequency divider 40 divides the frequency of a given input clock signal by two, thus supplying a divider output signal to other functional blocks. The delay element array 50 consists of a plurality of delay elements connected in series to delay the divider output signal. Here, each delay element has a fixed lag of τ and the resulting signals are referred to as the delay output signals. The delay element array 50 provides some of its delay output signals to other circuit blocks as follows: signals C(1) to C(p) to the edge detector 60, and signals F(1) to F(q) to the delayed signal selector 70.

Figure 4:
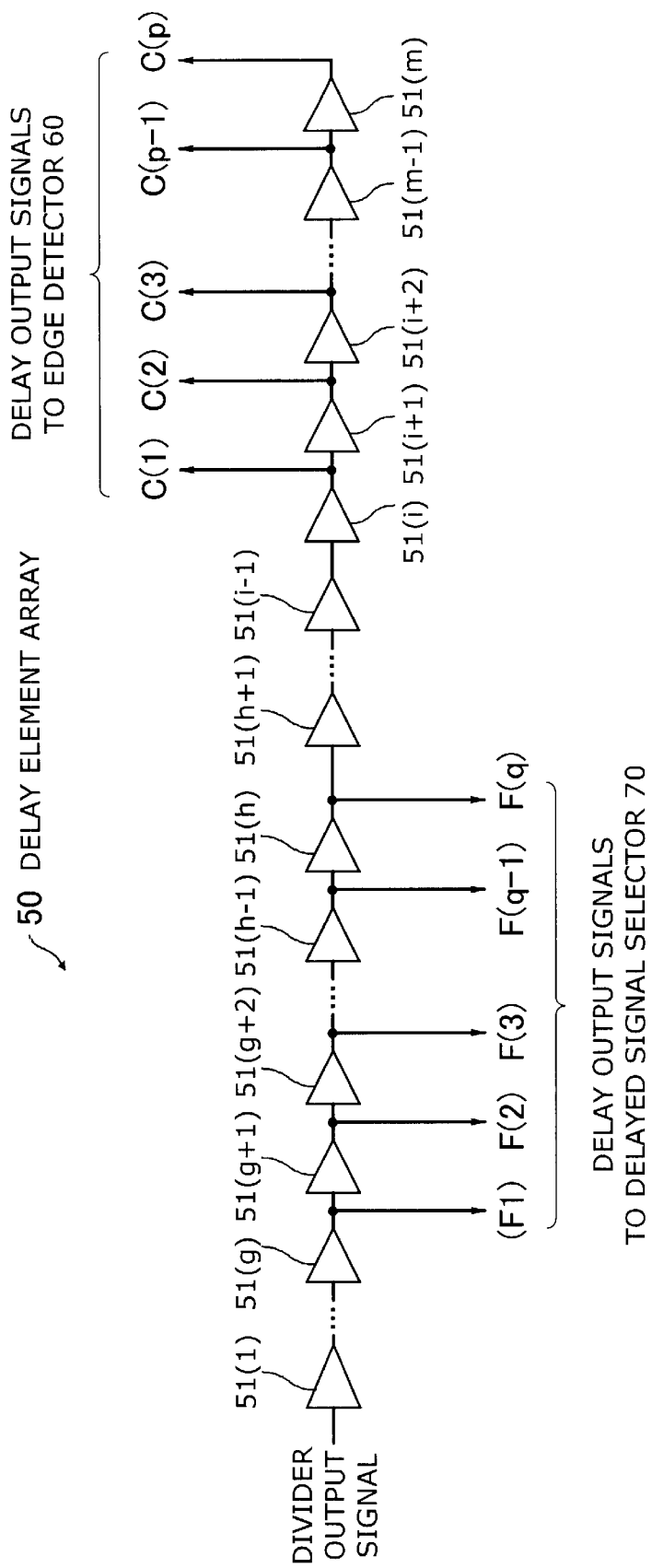
FIG. 4 gives the details of a delay element array shown in FIG. 3.

FIG. 4 shows the detailed structure of the delay element array 50. The illustrated delay element array 50 consists of a plurality (m) of delay elements 51(1) to 51(m), the first element 51(1) receiving the divider output signal from the frequency divider 40. Each element has a fixed delay time of τ and passes its delayed output to the next element. Of the m delay elements, the first group of delay elements 51(1) to 51(g−1) have no connections to the outside, only feeding their outputs to later stages. The second group of delay elements 51(g) to 51(h) (g≦h) supply their outputs to the delayed signal selector 70. Those q signals (q=h−g+1) are referred to as the delay output signals F(1) to F(q). The third group of delay elements 51(h+1) to 51(i−1) have no connections to outside, only feeding their outputs to next elements as in the first group elements 51(1) to 51(g−1). The fourth group of delay elements 51(i) to 51(m) supply their delayed outputs to the edge detector 60. These p delay output signals (p=m−i+1) are labeled C(1) to C(p).

Referring back to FIG. 3, the edge detector 60 identifies a falling edge of the divider output signal by applying exclusive-OR operations on the delay output signals C(1) to C(p) and the divider output signal itself (described later). The edge detector 60 notifies the delayed signal selector 70 of that phase detection result by sending detection signals.

Figure 5:
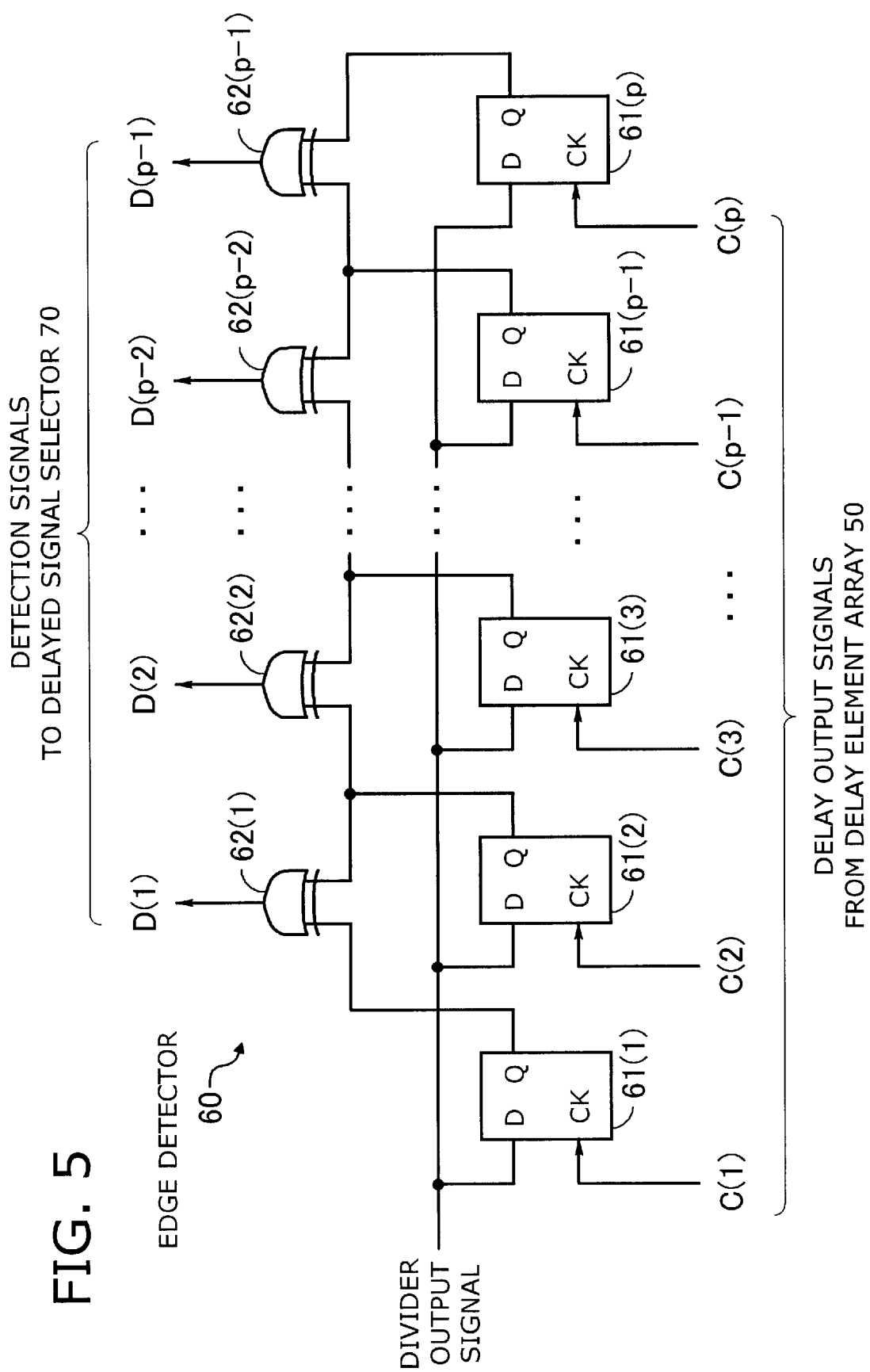
FIG. 5 gives the details of an edge detector shown in FIG. 3.

FIG. 5 shows the details of the edge detector 60. The illustrated edge detector 60 consists of a plurality of D-type flip-flops 61(1) to 61(p) and XOR gates 62(1) to 62 (p−1). The clock input terminals (CK) of the D-type flip-flops 61(1) to 61(p) are driven by the delay output signals C(1) to C(p) supplied from the delay element array 50, while their data input terminals (D) are commonly connected to the divider output signal. The output terminals (Q) of every two adjacent flip-flops are wired to input terminals of a corresponding XOR gate 62(1) to 62(p−1). The outputs of those XOR gates 62(1) to 62(p−1) are sent to the delayed signal selector 70, being labeled D(1) to D(p−1), respectively. Those signals D(1) to D(p−1) are referred to as the detection signals.

Figure 6:
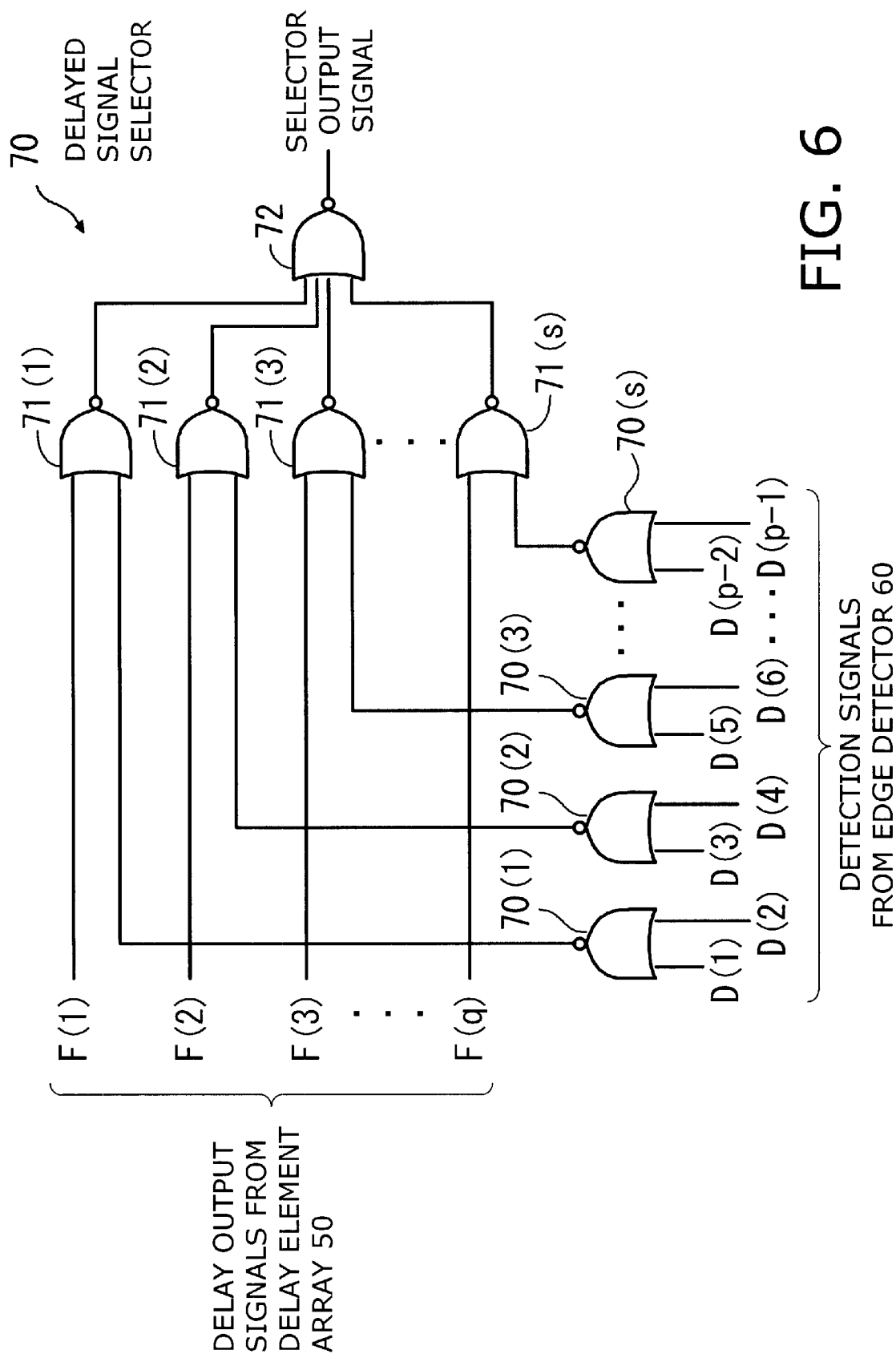
FIG. 6 gives the details of a delayed signal selector shown in FIG. 3.

Referring back to FIG. 3, the delayed signal selector 70 selects one of the delay output signals F(1) to F(q), based on the detection signals D(1) to D(p−1) received from the edge detector 60. FIG. 6 shows the detailed structure of the delayed signal selector 70. The illustrated selector 70 is composed of the following elements: a first group of 2-input NOR gates 70(1) to 70(s), a second group of 2-input NOR gates 71(1) to 71(s), and a multiple-input NOR gate 72.

The first group of NOR gates 70(1) to 70(s) perform a logical OR operation on every two consecutive detection signals D(n) and D(n+1), where n ranges from 1 to p−2. These NOR gates 70(1) to 70(s) output the results in negative logic, which are then supplied to the second group of NOR gate 71(1) to 71(s) for logical OR operation with the delay output signals F(1) to F(q). Their inverted results are ORed and inverted by the multiple-input NOR gate 72.

Figure 7:
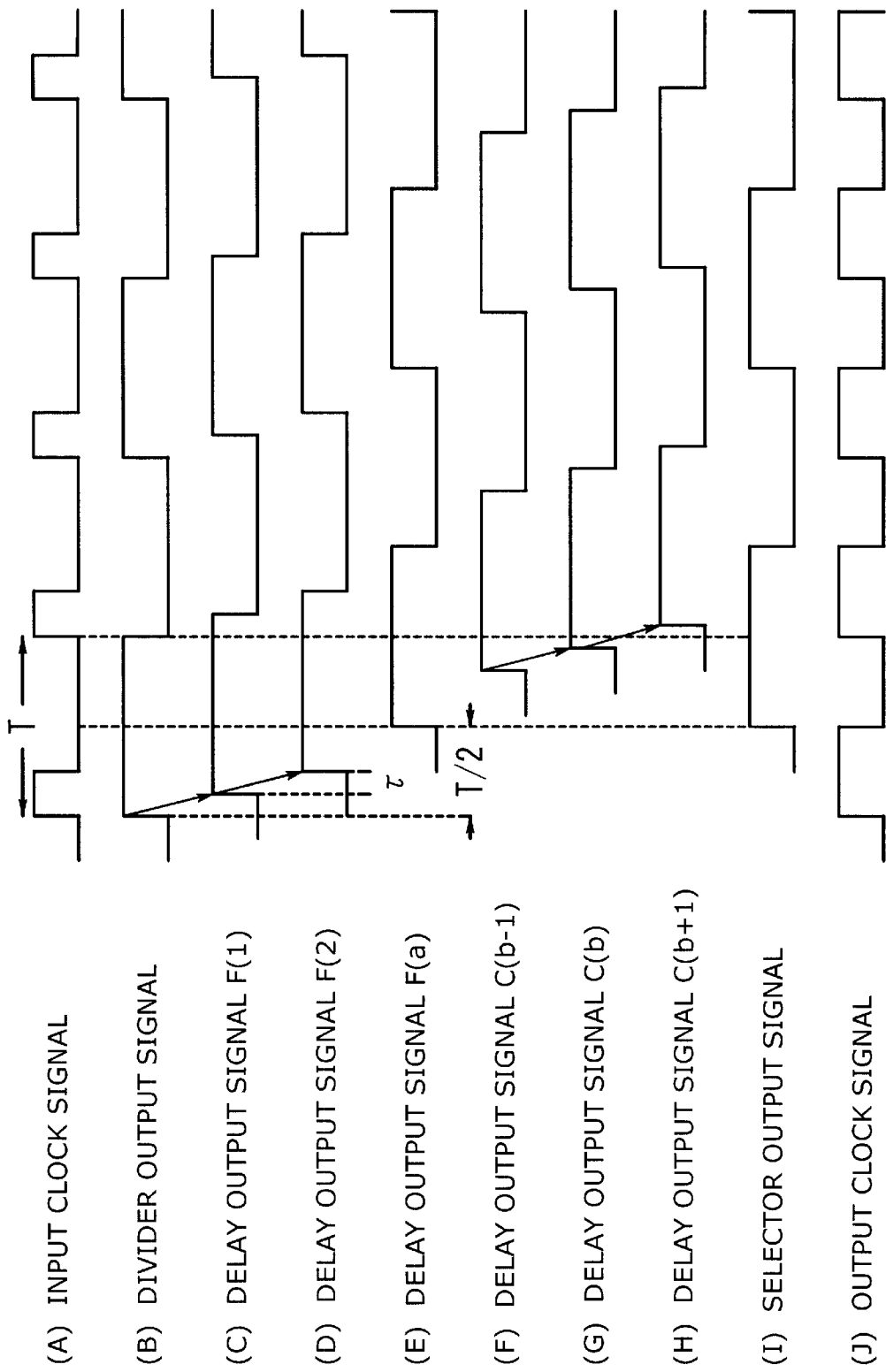
FIG. 7 is a timing diagram which shows the operation of the first embodiment of FIG. 3.

FIG. 7 is a timing diagram which shows the operation of the first embodiment. Referring first to part (A), the frequency divider 40 receives an input clock signal with a cycle time of T. The frequency divider 40 divides this signal by two, thereby producing a divider output signal shown in part (B) of FIG. 7. With its constituent delay elements 51(1) to 51(m), the delay element array 50 produces a series of delayed signals which have successively increasing delay times in increments of τ. Among such signals are delay output signals C(1) to C(p) produced by the fourth group of delay elements 51(i) to 51(m). The rising edges of C(1) to C(p) successively trigger the corresponding D-type flip-flops 61(1) to 61(p) in the edge detector 60, making them latch the same divider output signal at different timings.

Referring to parts (F) to (H) of FIG. 7, three consecutive delay output signals C(b−1), C(b), and C(b+1) are shown. As FIG. 7 shows, the divider output signal (B) is high when the delay output signal C(b−1) goes high, and it is still high at the rising edge of the next signal C(b). However, the divider output signal changes its state from high to low, before the third signal C(b+1) becomes high. That is, the high-to-low transition of the divider output signal occurs somewhere between C(b) and C(b+1), and that edge position can be identified by finding the first zero-valued bit in the series of flip-flop outputs.

The XOR gates 62(1) to 62(p−1) serve the above purpose, performing an XOR operation on each two consecutive outputs of the flip-flops 61(1) to 61(p). Since an XOR gate goes high when its two input signals disagree with each other, a high-level signal appearing at one of the XOR outputs, or detection signals, would indicate the occurrence of a high-to-low transition that is sought. In the present example, the first b flip-flops 61(1) to 61(b) are set to ones, while the remaining flip-flops 61(b+1) to 61(p) are set to zeros. Because the output of the b-th flip-flop 61(b) differs from that of the (b+1)-th flip-flop 61(b+1), the b-th XOR gate 62(b) asserts its output to high. This does not happen in the other XOR gates, and therefore, only the b-th detection signal D(b) becomes high while all the others remain low.

Receiving such detection signals D(1) to D(p−1) from the edge detector 60, the delayed signal selector 70 combines two detection signals successively and enters the resulting signal pairs to the NOR gates 70(1) to 70(s). Recall that 2-input NOR gates produce a high-level output when their inputs are both low, and a low-level output when either input is high. Because only the b-th detection signal D(b) is high in the present example, the (b/2)-th NOR gate 70(b/2) will be the sole active gate whose output is low, assuming that b is an even number. When b is an odd number, the single low-level output would appear at the NOR gate 70((b+1)/2). Note that all the other NOR outputs remain at a high state.

As a result of the above, most of the NOR gates 71(1) to 71(s) stay in the low output state, regardless of their respective delayed signal inputs. The only exception is the one receiving a low-level input from one of the preceding NOR gates 70(1) to 70(s). This NOR gate outputs an inverted version of the delay output signal that it is receiving. In the present example, only the NOR gate 71(b/2) or 71((b+1)/2) outputs an inverted version of the delay output signal of F(b/2) or F((b+1)/2), since it receives a low-level signal from the preceding NOR gate 70(b/2) or 70((b+1)/2).

The multiple-input NOR gate 72 performs a logical OR operation on all the outputs of the NOR gates 71(1) to 71(s) and inverts the result. In the present example, the NOR gate 72 outputs the delay output signal of F(b/2) or F((b+1)/2) because it is the only active input signal from the NOR gates 71(1) to 71(s). It should be noted again that whether to use the index (b/2) or (b+1)/2 depends on whether the number b is even or odd.

One of the key issues in designing the delayed signal selector 70 is how to select an appropriate delay output signal in association with an active detection signal. In the present embodiment, the delayed signal selector 70 is designed to choose a particular delay output signal so that its delay time value will be one half of the cycle time identified by the active detection signal. The NOR gate 72 thus outputs the divider output signal with a half-cycle delay.

Referring again to FIG. 7, the selected delay output signal F(a) is shown in part (E), where a=b/2 or (b+1)/2, depending on whether b is even or odd. This signal F (a) has a lag of T/2 with respect to the original divider output signal. The delayed signal selector 70 chooses and outputs it as the selector output signal shown in part (I) of FIG. 7.

Note here that the delayed signal selector 70 has its own delay time because its internal logic gates (e.g., two NOR-gate stages in the circuit of FIG. 6) have some amount of propagation delay. This delay time has to be taken into consideration when determining which delay output signal to choose in association with a particular detection signal.

The last-stage XOR gate 80 (FIG. 3) performs a logical XOR operation between the selector output signal and the original divider output signal, the former following the latter with a delay time of T/2. As stated previously, a logical XOR operation produces a high-level output only when two inputs disagree with each other. The XOR gate 80 therefore produces an output clock signal shown in part (J) of FIG. 7, which has a cycle time of T and a duty ratio of 50 percent.

As has been described above, the first embodiment of the present invention corrects duty cycle distortion of a given input clock signal by: (a) dividing the frequency of the given clock signal, (b) generating many delayed versions of the divided clock signal, (c) measuring the timing of a particular edge of the divided clock signal by comparing it with the created delayed signals, (d) selecting an appropriate delayed signal that is associated with the measured edge timing, and (e) producing an output clock signal by performing an XOR operation between the selected signal and the original divided clock signal. With this simple method, the proposed clock signal correction circuit creates an output clock signal with an accurate duty cycle.

Although the first embodiment has assumed a dividing ratio of ½, it is not intended to limit the invention to that specific ratio. The frequency of an input clock signal may be divided by any other numbers. It would be possible to produce a clock signal with a different cycle time by setting the dividing factor to three or greater.

The duty cycle may also be a design choice. The proposed clock signal correction circuit can produce a duty cycle other than 50 percent. The ratio is determined by the signal connections between the edge detector 60 and delayed signal selector 70, which is fully configurable to meet the actual needs.

Further, the above-described first embodiment may be slightly modified so as to provide an improved dynamic range in its duty cycle correction capabilities. Recall that the delay element array 50 of FIG. 4 contains four groups of delay elements, among which the fourth-group elements supply the edge detector 60 with delay output signals C(1) to C(p), and the second-group elements supply the delayed signal selector 70 with delay output signals F(1) to F(q). While those two groups are implemented as separate blocks of elements, it may also be possible to make them overlap in whole or in part.

Figure 8:
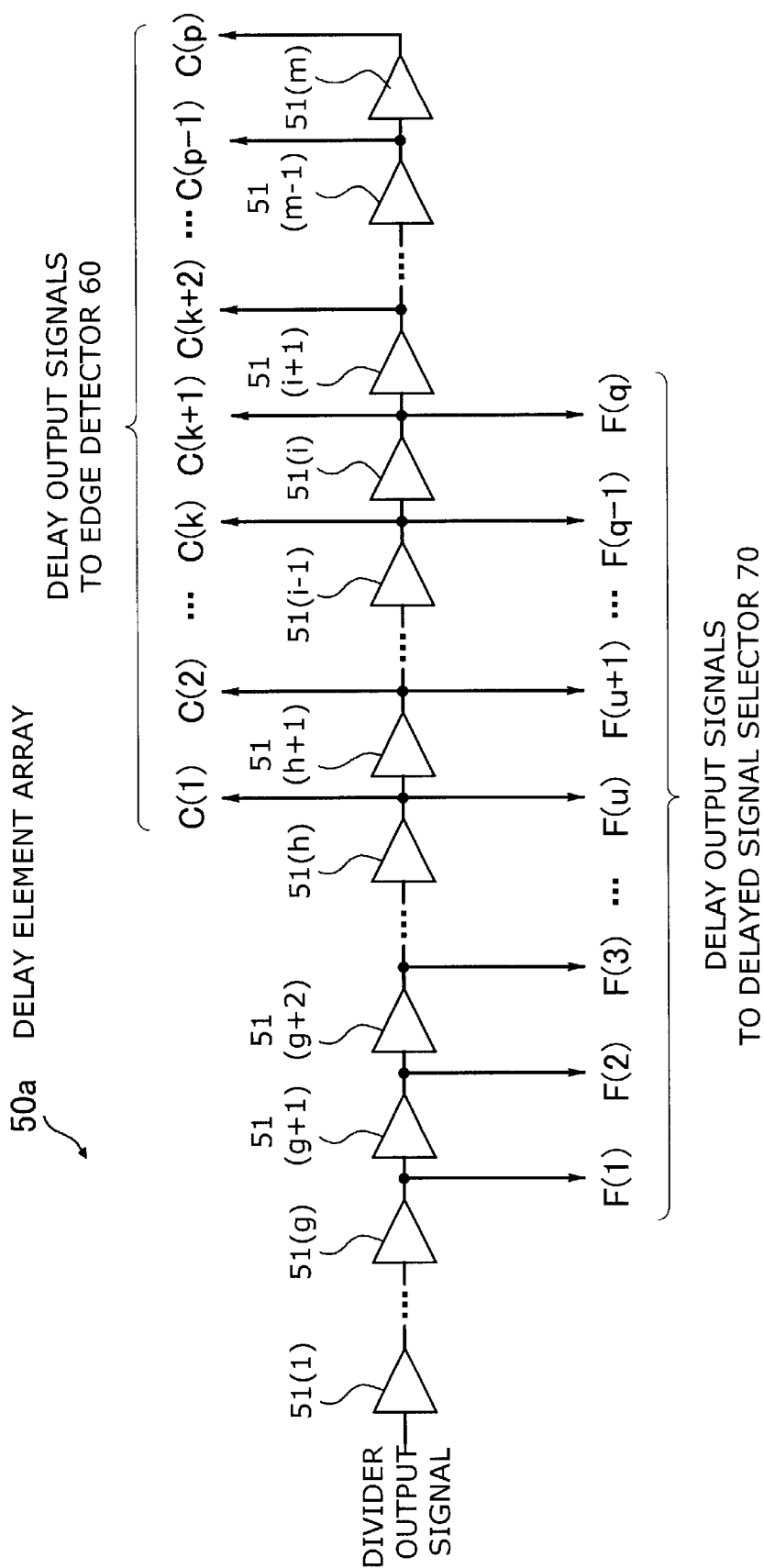
FIG. 8 shows an alternative configuration of the delay element array in FIG. 3.

FIG. 8 shows such an alternative configuration of delay elements. In the illustrated delay element array 50*a*, the second group of delay elements partly overlaps with the fourth group; i.e., the delay output signals C(1) to C(k+1) and F(u) to F(q) are extracted from common delay elements. Actually, such an arrangement implies that an increased number of delayed signals are supplied to the edge detector 60 and delayed signal selector 70. While the circuit becomes more complicated because of the increased amount of wiring, the above alternative configuration enables the clock signal correction circuit to accept a wider range of input clock signals having various cycle times.

For practical implementation of the present embodiment, it is desired that all the delay elements have the same characteristics and operate on well-balanced conditions. This would ensure the linearity of the delay element array's outputs, making the circuit design easier. Actually, however, the delay elements shown in FIG. 8 are not necessarily uniform in terms of their loading conditions. It is known that a logic circuit with a heavier load exhibits a larger delay time, which increases proportionally to the number of inputs being connected thereto.

In the example of FIG. 8, some delay elements such as 51(1) to 51(g−1) are linked only to their subsequent elements, but have no connections to outside circuits. Compared to those delay elements, the other elements are expected to show larger delay times because they have to drive one or two more logic gates. To compensate for such a load imbalance, appropriate capacitors may be added as shown in FIG. 9, depending on the number of input loads, so that all delay elements will have the same propagation delay time.

Figure 9:
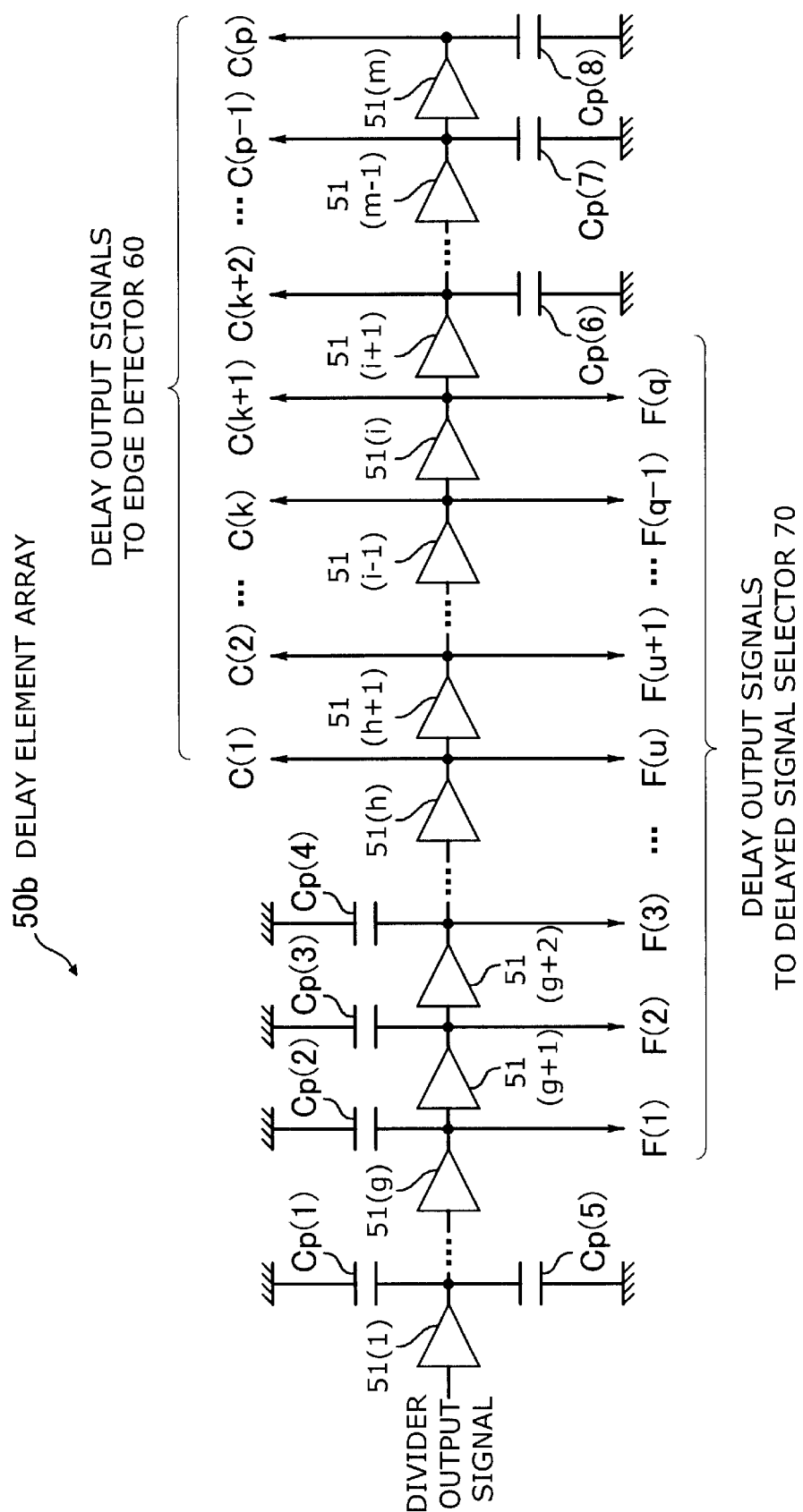
FIG. 9 shows yet another alternative configuration of the delay element array in FIG. 3.

In the example of FIG. 9, the first delay element 51(1) has two capacitors Cp(1) and Cp(5) because that element has no other connections. While not depicted in FIG. 9, the subsequent delay elements have similar capacitors. The g-th and later delay elements 51(*g*) to 51((h−1) are loaded with one additional capacitor, as are the last group of delay elements 51(i+1) to 51(*m*), since they have only one external load connection. Those capacitors are labeled Cp(2) to Cp(8) in FIG. 9. The remaining delay elements 51(*h*) to 51(*i*) have no capacitors, because they have two external load connections.

In the way explained above, the loading conditions of delay elements are equalized by adding an appropriate number of compensating capacitors. Those capacitors make all the delay elements operate with the same delay time, thus improving the accuracy of the clock signal correction circuit in its entirety. As an alternative method for compensation, dummy devices (e.g., logic operators) may be used, instead of capacitors.

Further, the circuit designer may calculate the total input capacitance that each delay element has to drive, instead of counting the number of devices being connected thereto. In this case, the number of (or equivalent capacitance of) compensating capacitors or dummy elements is to be determined in accordance with the actual load capacitance of each individual delay element.

Figure 10:
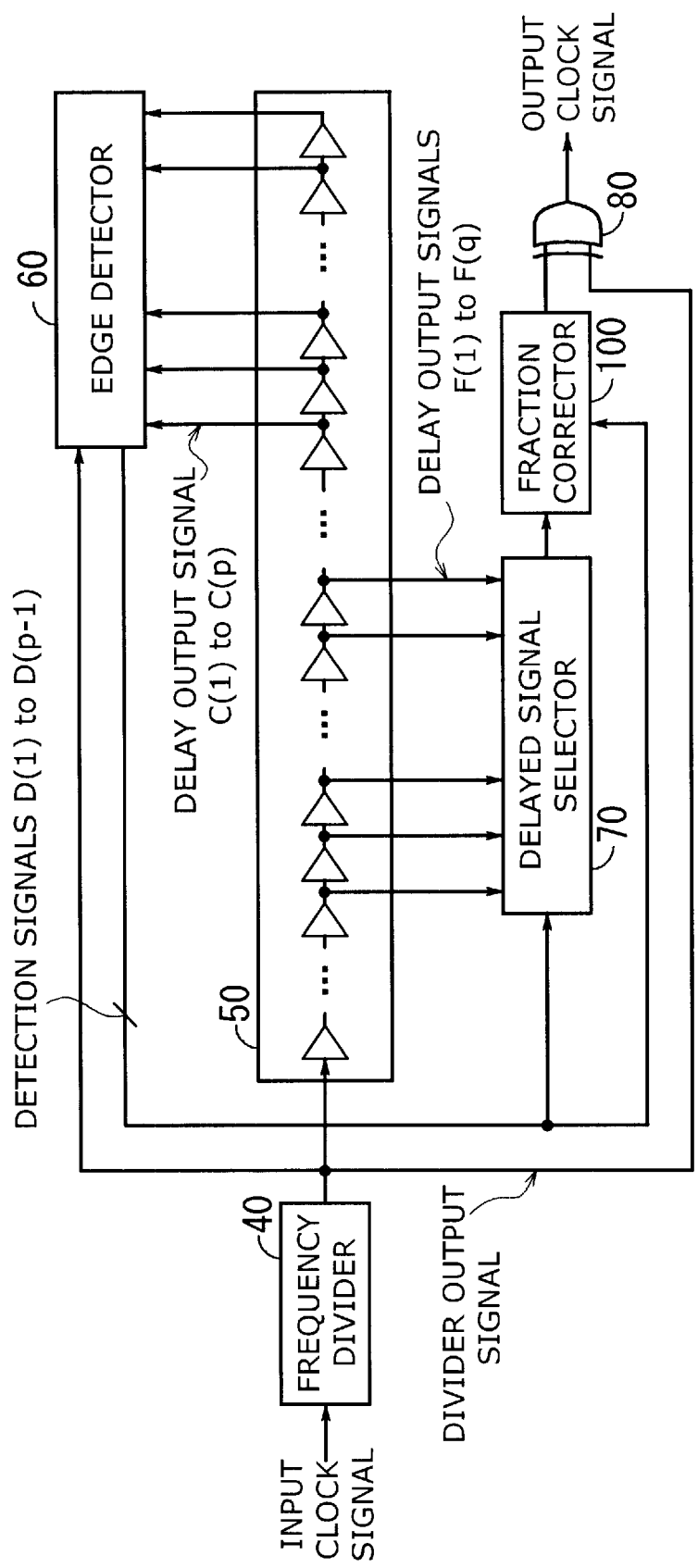
FIG. 10 is a block diagram of a clock signal correction circuit according to a second embodiment of the present invention.
Figure 11A:
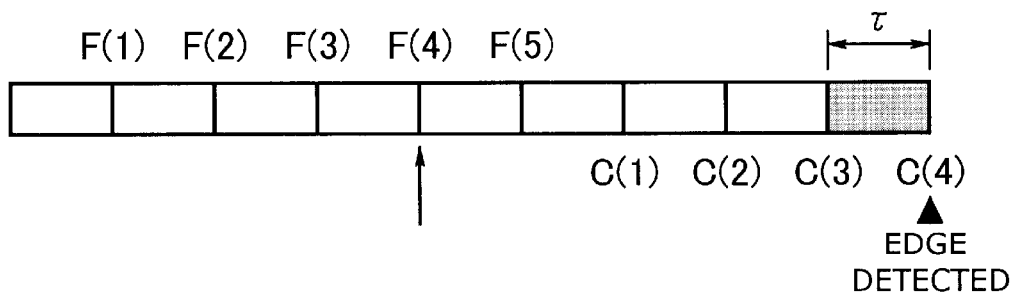
FIGS. 11(A) and 11(B) explain the reason for having a fraction corrector in the circuit of FIG. 10, illustrating a case where a most likely delay output signal can be found (FIG. 11(A)) and another case where such a signal cannot be found (FIG. 11(B))
Figure 11B:
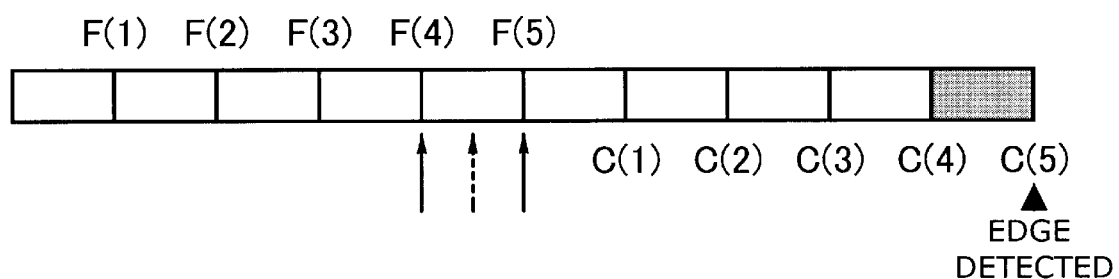
Figure 12:
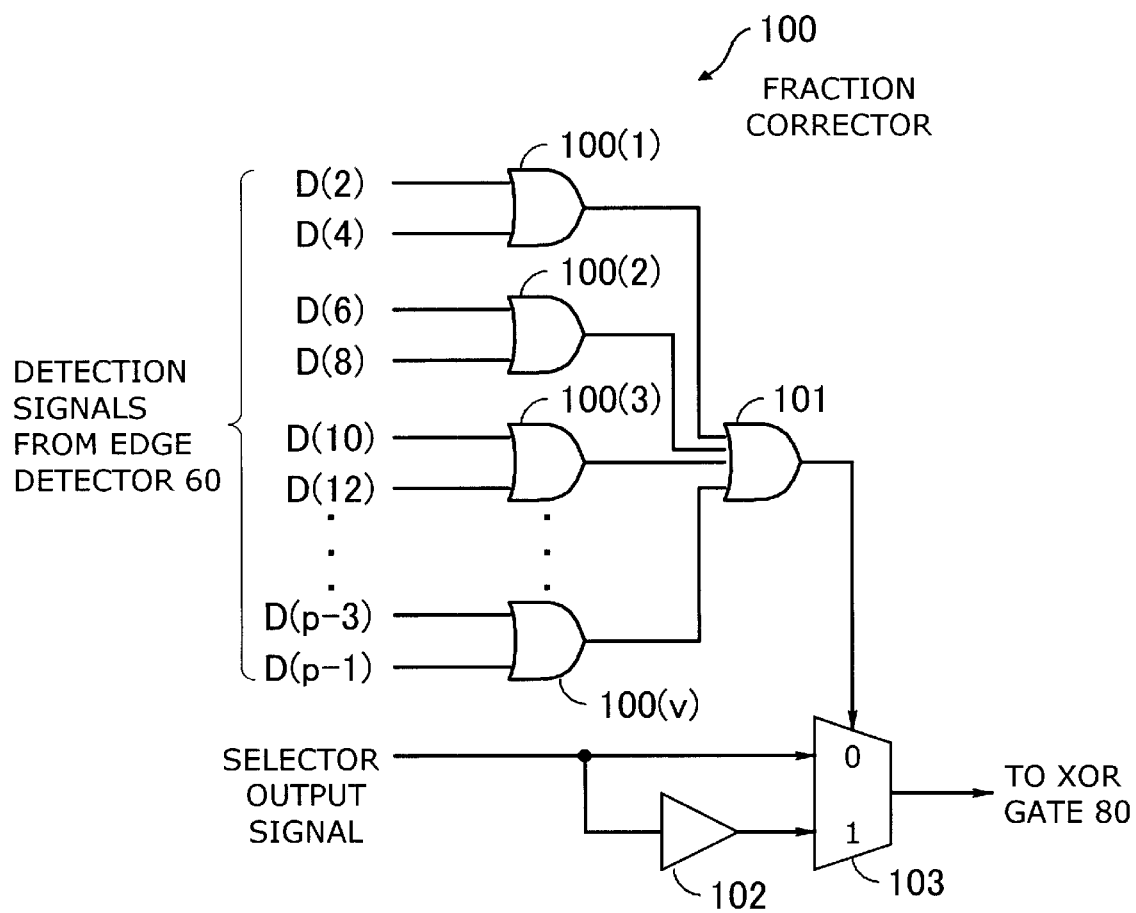
FIG. 12 shows the details of the fraction corrector shown in FIG. 10.

Referring next to FIGS. 10 to 12, another embodiment of the present invention will be described. FIG. 10 shows the structure of a clock signal correction circuit according to a second embodiment. This circuit shares many common components with the first embodiment explained earlier in FIG. 3. Therefore, the following section will focus on its distinctive points, while affixing like reference numerals to like elements.

In short, the second embodiment differs from the first embodiment in that a fraction corrector 100 is inserted between the delayed signal selector 70 and XOR gate 80. The fraction corrector 100 improves the accuracy of the clock signal correction circuit by processing a fractional delay time, if any. The term "fraction" refers to an uncertain fractional delay time that occurs when the edge detector 60 fails to specify a unique delay output signal for the delayed signal selector 70. The following section provides some brief background knowledge, before moving into details of the fraction corrector 100.

FIGS. 11(A) and 11(B) explain the principle of the fraction corrector 100. First, FIG. 11(A) shows a case where no fraction is produced. Each box represents a unit delay time that a single delay element produces. Labels "F(1)" to "F(5)" on those boxes indicate their corresponding delay output signals F(1) to F(5) being supplied to the delayed signal selector 70. The other labels "C(1)" to "C(4)" under the boxes indicate their corresponding delay output signals C(1) to C(4) being supplied to the edge detector 60.

Consider, for example, that the edge detector 60 has detected a falling edge of the divider output signal at the rising edge of the delay output signal C(4). It should be noted here that there is some uncertainties in the observed timing of the falling edge. Exactly speaking, the falling edge might have occurred somewhere between C(3) and C(4) as indicated by the hatched box, meaning that the observed timing may involve an error of at most one unit delay time τ.

As described previously, the delayed signal selector 70 is designed to select one of the delay output signals that is associated with the active detection signal supplied from the edge detector 60. In the context of FIG. 11(A), the delayed signal selector 70 chooses the fourth delay output signal F(4) because its delay time is equivalent to one half of C(3)'s and that is obviously the most likely half-cycle point of the divider output signal.

The above example shows the case where there is an appropriate delay output signal that can provide exactly the required delay time (i.e., one half of the observed edge's delay time). However, this may not always be the case. See FIG. 11(B) for another situation where a falling edge has been detected when the fifth delay output signal C(5) goes high, meaning that the divider output signal has changed somewhere between C(4) and (C5), as indicated by the hatching. In this case, the most likely half-cycle point is supposed to be the midpoint between F(4) and F(5) as indicated by the dotted arrow in FIG. 11(B), since it gives one half of the signal C(4)'s delay time. The first embodiment shown in FIG. 3 is, however, unable to provide such a midpoint timing that includes a fractional delay value. For this reason, the delayed signal selector 70 has to choose either the fourth delay output signal F(4) or fifth delay output signal F(5), leaving the problem of rounding errors and consequent inaccuracy.

The second embodiment is intended to correct such errors described in FIGS. 11(A) and 11(B), when the delayed signal selector requires a fractional delay time. This purpose is achieved by employing another delay element that adds a fractional delay to the selected delay output signal.

FIG. 12 shows the detailed structure of the fraction corrector 100. This fraction corrector 100 is constructed with the following components: 2-input OR gates 100(1) to 100(v), a multiple-input OR gate 101, a delay element 102, and a selector 103.

The 2-input OR gates 100(1) to 100(v) perform a logical OR operation on each pair of consecutive even-numbered detection signals, such as D(2) and D(4). The multiple-input OR gate 101 combines the outputs of those OR gates 100(1) to 100(v). The OR gate 101 goes high when any one of the even-numbered detection signal is active. Otherwise, its output stays at a low level.

The delay element 102 has a delay time of (τ/2), i.e., one half of the unit delay time τ that a single element of the delay element array 50 provides. This additional delay τ/2 is added to a signal selected by the delayed signal selector 70. The selector 103 selects either the delayed signal or original signal, depending on a selection command signal supplied from the multiple-input OR gate 101. More specifically, it chooses the original signal received directly from the delayed signal selector 70 when the selection command signal is low ("0"). When the command signal is high ("1"), the selector 103 selects the delayed signal received from the delay element 102. The next section will describe the operation of the second embodiment.

Now, recall the situation assumed in FIG. 11(A), where the edge detector 60 has detected a falling edge of the divider output signal at the timing of C(4), making the third detection signal D(3) active. In this context, the activated detection signal D(3) causes the delayed signal selector 70 to output the fourth delay output signal F(4) to the fraction corrector 100. In the fraction corrector 100, the output of the OR gate 101 stays low because none of its inputs are high. Accordingly, the selector 103 allows the delay output signal F(4) to reach the XOR gate 80. That is, the clock signal correction circuit of the second embodiment brings exactly the same result as what was explained in FIG. 11(A).

Then consider the other example case discussed in FIG. 11(B), where the edge detector 60 has detected a falling edge of the divider output signal at the timing of C(5). Since the fourth detection signal D(4) becomes active in this case, the delayed signal selector 70 selects and outputs the fourth delay output signal F(4) to the fraction corrector 100. The activated detection signal D(4) also causes the OR gate 101 in the fraction corrector 100 to output a high-level signal. The selector 103 thus chooses the output of the delay element 102, supplying the XOR gate 80 with the delay output signal F(4) with an extra delay of τ/2. In this way, the fraction corrector 100 of the second embodiment produces a more accurate delay time, as indicated by the dotted arrow in FIG. 11(B), when a fractional delay is demanded by the edge detector 60 and delayed signal selector 70.

While the second embodiment has been described on the assumption that the fractional delay is half of the unit delay time τ, the present invention should not be limited to this specific factor. It is also possible to configure the proposed circuit to adjust the duty ratio of a given clock signal with a resolution of 1/b of the unit delay time. This feature is accomplished by configuring the fraction corrector 100 to have (b−1) delay elements with a delay time of one b-th of the unit delay, so that any amount of fractional delay will be produced from those fine delay elements.

Figure 13:
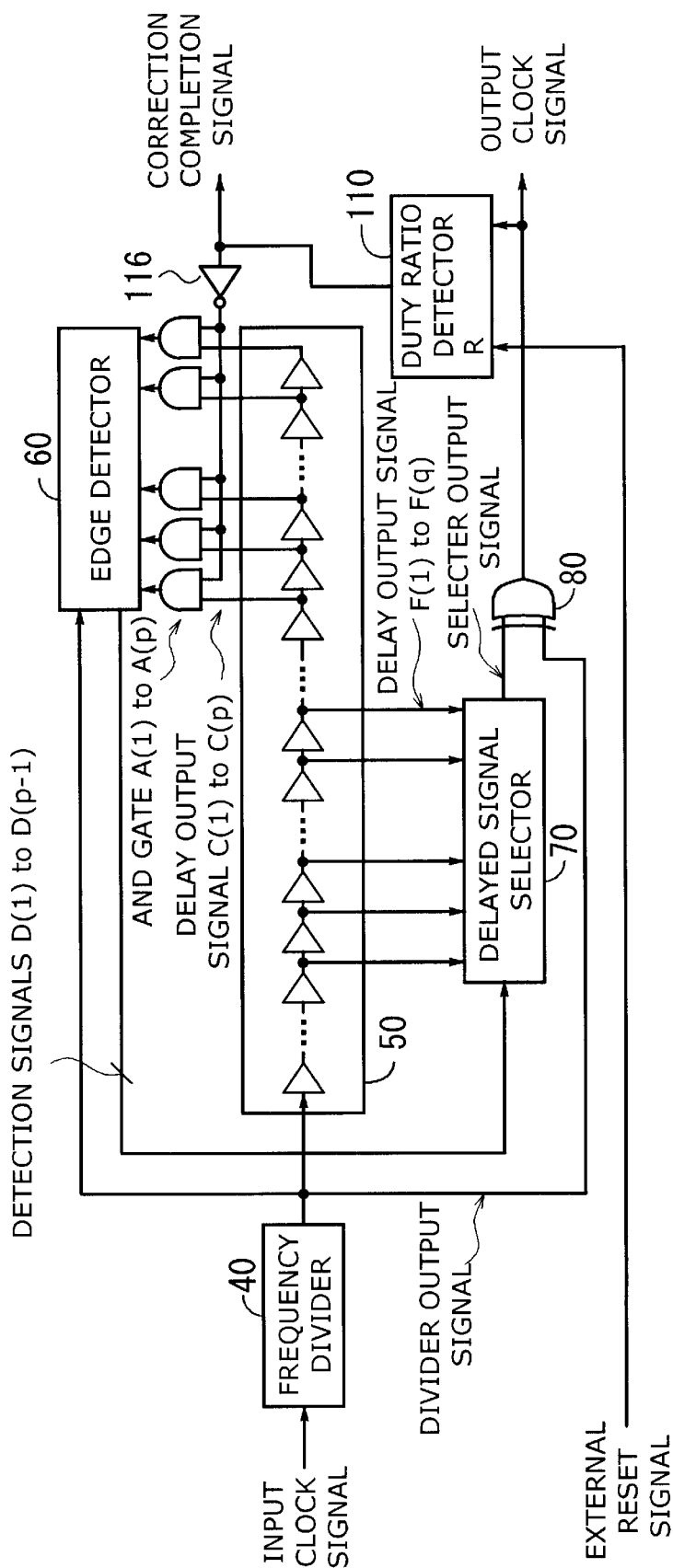
FIG. 13 is a block diagram of a clock signal correction circuit according to a third embodiment of the present invention.
Figure 14:
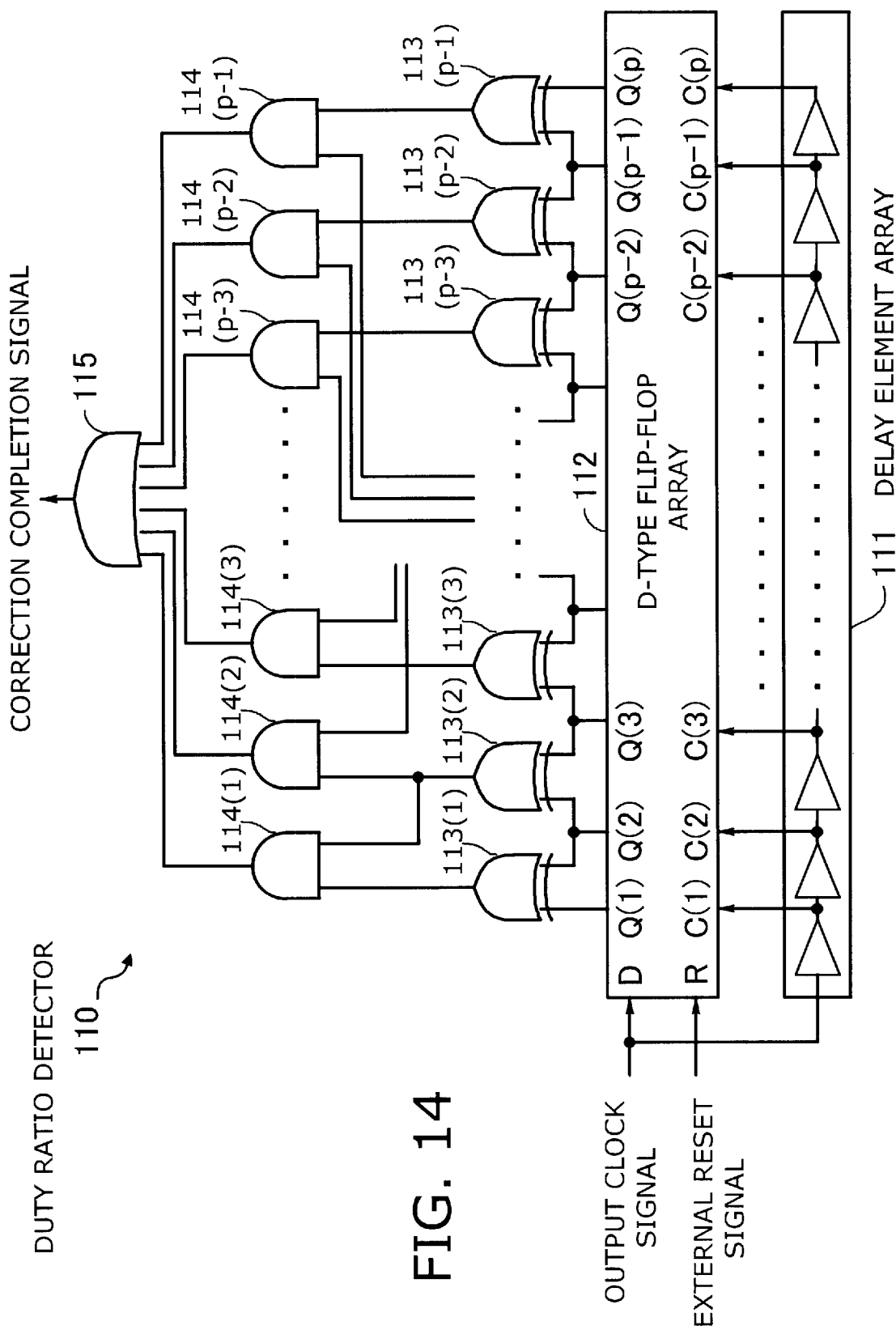
FIG. 14 gives the details of a duty ratio detector shown in FIG. 13.

Referring next to FIGS. 13 and 14, yet another embodiment of the present invention will be described. FIG. 13 is a block diagram of a clock signal correction circuit of a third embodiment of the present invention. Since this circuit shares many common components with the first embodiment explained earlier in FIG. 3, the following section will focus on its distinctive points, while affixing like reference numerals to like elements. Compared with the first embodiment, the third embodiment employs a duty ratio detector 110, 2-input AND gates A(1) to A(p), and an inverter 116 as additional components. About the other functional blocks, see FIG. 3 and related part of the description.

The duty ratio detector 110 tests the output clock signal that is produced by the XOR gate 80, so as to determine whether it has a predetermined duty ratio. It reports the test result through a correction completion signal, which will be set to high if the output clock signal passes the test. The duty ratio detector 110 has a reset (R) input terminal to accept an external reset signal.

FIG. 14 shows the detailed structure of the duty ratio detector 110. The illustrated detector 110 has the following components: a delay element array 111, a D-type flip-flop array 112, XOR gates 113(1) to 113(p−1), 2-input AND gates 114(1) to 114(p−1), and a multiple-input OR gate 115.

The delay element array 111 consists of a plurality of delay elements each having a delay time of τ, the first element of which receives an output clock signal. With those cascaded delay elements, the delay element array 111 produces a series of delayed signals which have successively increasing delay times in increments of τ.

The D-type flip-flop array 112 is a collection of D-type flip-flops sharing a common data input terminal (D), to which the output clock signal is given. Their clock inputs C(1) to C(p) are driven by the successively-delayed output clock signals supplied from the delay element array 111. The D-type flip-flop array 112 thus latches the output clock signal at each rising edge of C(1) to C(p), the results appearing at relevant output terminals Q(1) to Q(p). All the internal flip-flops are cleared by an external reset signal entered through the reset (R) terminal of the array 112.

The XOR gates 113(1) to 113(p−1) are connected to the output terminals Q(1) to Q(p) of the D-type flip-flop array 112, each performing a logical XOR operation between two consecutive signals. The subsequent AND gates 114(1) to 114(p−1) perform a logical AND operation between two XOR outputs that are selected in such a way that the delay time associated with one XOR gate is a double or half of the delay time associated with the other XOR gate. The OR gate 115 performs a logical OR operation on all the outputs of the preceding AND gates 114(1) to 114(p−1).

Referring back to FIG. 13, the inverter 116 supplies the AND gates A(1) to A(p) with an inverted version of the correction completion signal produced by the duty ratio detector 110. According to this signal, the AND gates A(1) to A(p) pass or block the delay output signals C(1) to C(p) before they reach the edge detector 60.

The clock signal correction circuit of the third embodiment operates as follows. Initially, the circuit of FIG. 13 receives an external reset signal, along with an input clock signal that has just become available. The reset signal clears the duty ratio detector 110, thus making the correction completion signal low. This low level of the correction completion signal makes the inverter 116 go high, and permits the edge detector 60 to receive delay output signals C(1) to C(p) from the delay element array 50 through the AND gates A(1) to A(p). The edge detector 60 and delayed signal selector 70 then operate together as usual, detecting an edge of the divider output signal, and selecting an appropriate delay output signal with a half-cycle delay, based on the detected edge position. The XOR gate 80 now reproduces an original-rate clock signal from two half-rate divider output signals that are out of phase by 90 degrees. Accordingly, the resultant output clock signal gains a corrected duty cycle of 50 percent.

Inside the fraction corrector 100, the delay element array 111 supplies the D-type flip-flop array 112 with a series of trigger signals that are created from the output clock signal by successively delaying that signal in increments of τ. The D-type flip-flop array 112 samples the given output clock signal at each rising edge of the trigger signals supplied from the delay element array 111, thus sending out the latched signals from its output terminals Q(1) to Q(p). The XOR gates 113(1) to 113(p−1) compare every two consecutive output signals, thus indicating each edge position of the output clock signal with a high-level output.

Because the output clock signal has to have a corrected duty ratio, its edges should be found at a particular pair of XOR outputs. The AND gates 114(1) to 114(p−1) are arranged to detect various patterns of such edge positions, and the OR gate 115 collects the results from the AND gates 114(1) to 114(p−1) to produce a correct completion signal. Therefore, the OR gate 115 asserts the correction completion signal if the detected edges of the given output clock signal match with any of the prepared patterns.

The high-level output of the duty ratio detector 110 informs the subsequent circuit (not shown) that the duty cycle of the clock signal has successfully been corrected. It also makes the inverter 116 go low, which causes the AND gates A(1) to A(p) to block the delay output signals C(1) to C(p). The flip-flops 61(1) to 61(p) in the edge detector 60 then keep holding their previous states (i.e., memorizing the previous bit pattern of edges) because their clock inputs will no longer be triggered. The detection signals also keep their present states accordingly, permitting the delayed signal selector 70 to maintain the current choice of a delay output signal. Thus the XOR gate 80 continues producing the output clock signal with the same duty ratio as previously established.

As seen from the above explanation, the clock signal correction circuit outputs a correction completion signal to the subsequent circuits when the clock signal has gained an intended duty cycle. This feature of the third embodiment ensures the subsequent circuit blocks to operate properly, without being confused by an unexpected clock duty cycle.

The third embodiment is also designed to stop operating the edge detector 60 once the intended duty cycle is established. This function fixes the detected edge position, thus eliminating clock jitters which could happen if the edge detector 60 was not stopped. The edge detector 60, however, may be configured to resume its operation on a certain event (e.g., expiration of a predetermined period). This alternative configuration avoids the risk of locking the duty cycle at a wrong point accidentally.

Further, in the third embodiment, an external source (e. g., a preceding circuit block) provides a reset signal to initialize the clock signal correction circuit. One simple implementation is to produce such a reset signal in synchronization with the system's power-up process.

Figure 15:
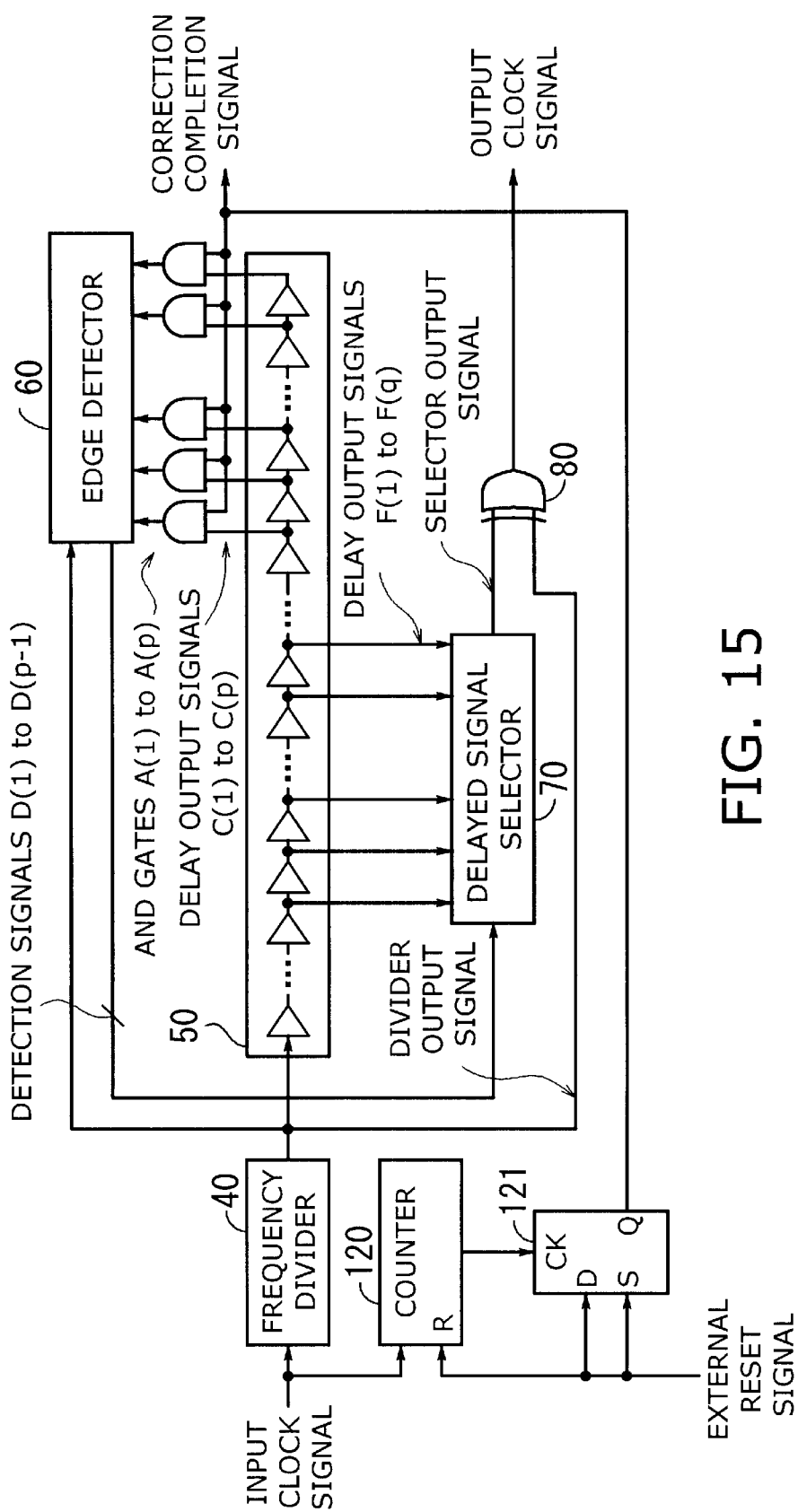
FIG. 15 is a block diagram of a clock signal correction circuit according to a fourth embodiment of the present invention.
Figure 16:
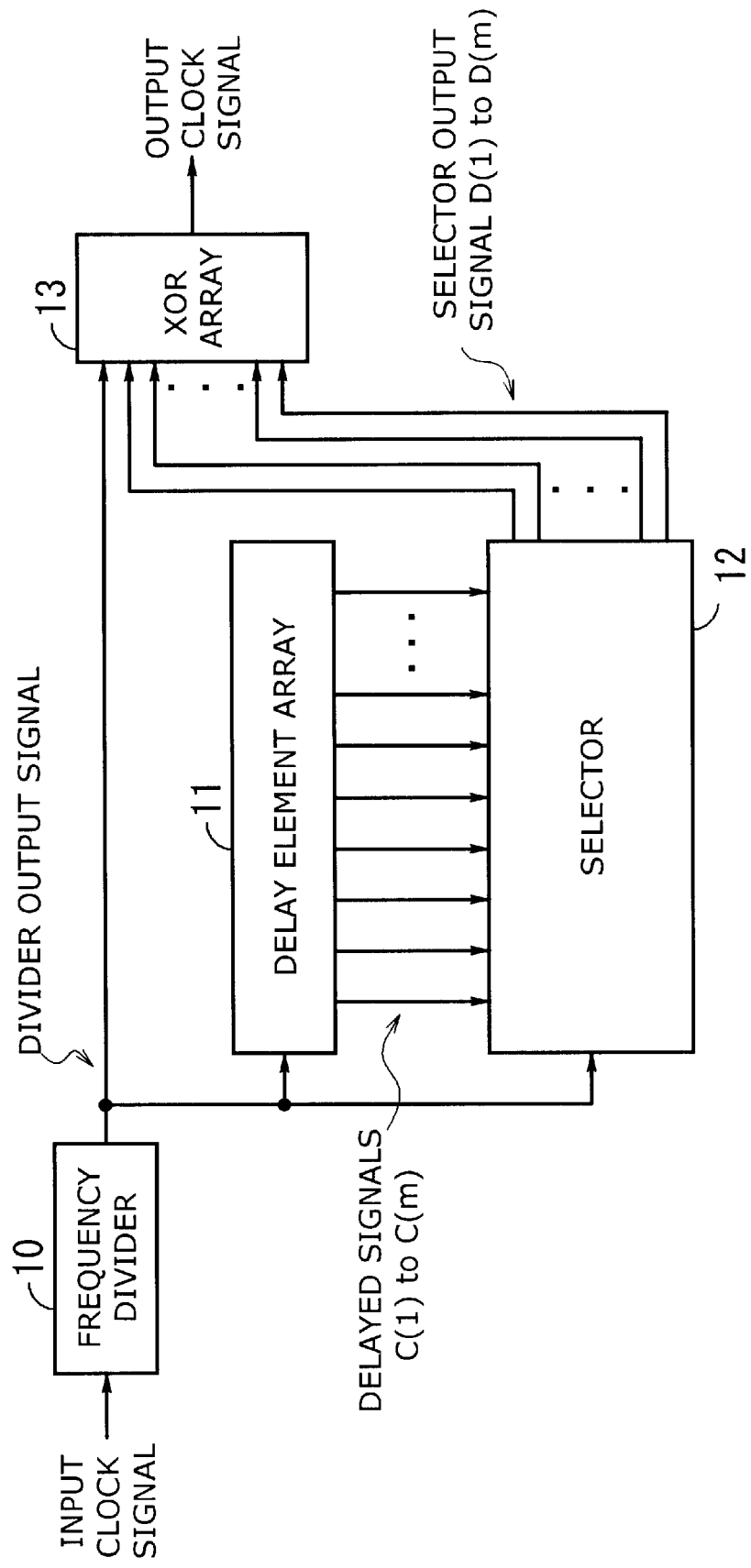
FIG. 16 shows the structure of a conventional clock signal correction circuit.

Referring to FIG. 15, a still another embodiment of the present invention is illustrated. FIG. 15 is a block diagram of a clock signal correction circuit according to a fourth embodiment of the invention. Since this circuit shares many common components with the first embodiment explained earlier in FIG. 3, the following section will focus on its distinctive points, while affixing like reference numerals to like elements.

Unlike the first embodiment (FIG. 3), the fourth embodiment has a counter 120, a D-type flip-flop 121, and AND gates A(1) to A(p). The counter 120 counts, for example, the rising edges of an input clock signal and outputs a high-level signal when a predefined count value is reached. The counter 120 has a reset input which is driven by an external reset signal. The D-type flip-flop 121 is initially set to a high state with an active external reset signal entered to its Set (S) input. When the counter output goes high, the flip-flop 121 takes in the current state of the external reset signal. The output (Q) of this flip-flop 121 is used as what has been described as the correction completion signal in the third embodiment, which is, however, an active-low (or negative logic) signal in the fourth embodiment. The AND gates A(1) to A(p) pass the delay output signals C(1) to C(p) to the delay element array 50 only when the correction completion signal is high (i.e., inactive).

The fourth embodiment operates as follows. After being initialized by an external reset signal, the counter 120 counts up at every rising edge of the input clock signal being supplied. Initially, the D-type flip-flop 121 is set to a high state because the external reset signal is asserted for a short time. The correction completion signal, the output of this flip-flop 121, becomes high accordingly. Since the correction completion signal is an active-low logic signal, as previously stated, this initial high state means that the correction has not been completed. The AND gates A(1) to A(p) thus supply the edge detector 60 with delay output signals C(1) to C(p), permitting it to start seeking an edge of the divided clock signal, as in the third embodiment. When an edge is identified, the edge detector 60 notifies the delayed signal selector 70 of that result through a set of detection signals. Based on those detection signals, the delayed signal selector 70 selects one of the delay output signals for delivery to the XOR gate 80. As a result, an output clock signal with a corrected duty cycle appears at the output of the XOR gate 80.

When a predetermined time (which must be long enough to complete the correction) has passed after the external reset signal is negated, the counter 120 outputs a high-level signal. This signal makes the D-type flip-flop 121 go low, since it samples the current state of the external reset signal that has already become low. Now that the correction completion signal is active, the AND gates A(1) to A(p) turn off their outputs, causing the edge detector 60 to keep the current state. A jitter-free output clock signal is obtained in this way, as in the third embodiment described earlier.

In summary, the fourth embodiment provides a simple circuit to provide a correction completion signal and avoid clock jitters. The proposed circuit counts the input clock signal with a counter 120 and sets a D-type flip-flop 121 after the expiration of a predetermined time, thereby asserting a correction completion signal to halt the operation of the edge detector 60.

While the first to fourth embodiments have been described on an assumption that the edge detector 60 supplies the delayed signal selector 70 with all of its detection signals directly, the present invention should not be limited to that specific configuration. Alternatively, the edge detector 60 may be designed to send only even-numbered detection signals, together with a signal indicating that an odd-numbered detection signal becomes active. That is, the edge detector 60 sends even-numbered detection signals directly to the delayed signal selector 70 when any of them is active. When an odd-numbered detection signal becomes active, the edge detector 60 asserts the nearest even-numbered detection signal, and sends it together with the odd-number indication signal, so that the active detection signal is identified on the side of the delayed signal selector 70. This alternative configuration reduces the number of wires for detection signals almost by half, thus simplifying and speeding up the circuit.

The above discussion will now be summarized as follows. According to one aspect of the present invention, a frequency divider divides the frequency of a given input clock signal by a natural number n, thereby producing a divided clock signal. The phase of this divided clock signal is identified by a phase detector. A delay unit adds an appropriate delay to the divided clock signal according to the identified signal phase, thereby producing a delayed divided clock signal. A logical operator creates an output clock signal by performing a logical operation on the original divided clock signal and the delayed divided clock signal. With such arrangement, the proposed clock signal correction circuit corrects duty cycle distortions of a clock signal in a simple and accurate way.

According to another aspect of the present invention, the above clock signal correction circuit is integrated into a semiconductor device, which corrects duty cycle distortions of an input clock signal in a simple and accurate way.

According to yet another aspect of the present invention, a correction circuit corrects duty cycle distortions of a clock signal received by an input circuit. When an output circuit outputs the clock signal with the corrected duty cycle, and a notification circuit notifies other circuits that the duty cycle of the received clock signal has been corrected. This clock signal correction circuit ensures correct use of the output clock signal in the entire system.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A clock signal correction circuit which corrects duty cycle distortions of an input clock signal, comprising:

a frequency divider which divides the frequency of the input clock signal by a natural number n, thereby producing a divided clock signal;

a phase detector which identifies the phase of the divided clock signal;

a delay unit which produces a delayed divided clock signal by adding a delay to the divided clock signal according to the identified phase of the divided clock signal; and a logical operator which produces an output clock signal by performing a logical operation on the divided clock signal and delayed divided clock signal, wherein said phase detector includes a first delay element array having a plurality of delay elements which produce a first series of delayed signals by adding successively increasing delays to the divided clock signal, and an edge detector which identifies an edge position of the divided clock signal by examining the divided clock signal with reference to the first series of delayed signals produced by said first delay element array;

wherein said delay unit includes a second delay element array having a plurality of delay elements which produces a second series of delayed signals by adding successively increasing delays to the divided clock signal, and a delayed signal selector which selects one of the second series of delayed signals that is associated with the edge position identified by said edge detector, and outputs the selected delayed signal as the delayed divided clock signal; and wherein said phase detector and said delay unit share a common delay element array as the first and second delay element arrays.

2. The clock signal correction circuit according to claim 1, wherein said edge detector receives the first series of delayed signals from a part of said common delay element array.

3. The clock signal correction circuit according to claim 1, wherein said delayed signal selector receives the second series of delayed signals from a part of said common delay element array.

4. The clock signal correction circuit according to claim 1, wherein said common delay element array has such outputs that are supplied exclusively to either said edge detector or said delayed signal selector.

5. The clock signal correction circuit according to claim 1, wherein said common delay element array has such outputs that are supplied to both of said edge detector and delayed signal selector.

6. The clock signal correction circuit according to claim 1, wherein said edge detector and delayed signal selector are connected to isolated groups of outputs of said common delay element array.

7. The clock signal correction circuit according to claim 1, wherein:

said common delay element array has such lightly-loaded outputs that are connected to only one of or none of said delayed signal selector and edge detector; and dummy loads are added to the lightly-loaded outputs, so that all the outputs of said common delay element array will be evenly loaded.

8. The clock signal correction circuit according to claim 1, wherein:

said delay unit further comprises a plurality of (b−1) of fine delay elements, each of which has one b-th of unit delay time that the second delay element array provides, where b is an integer equal to or greater than two; and said delayed signal selector creates a fractional delay by combining a required number of said fine delay elements and adds the fractional delay to the selected delayed signal.

9. The clock signal correction circuit according to claim 1, further comprising a correction completion signal generator which produces a correction completion signal indicating that the duty cycle has been corrected, when said logical operator outputs the output clock signal with the corrected duty cycle.

10. The clock signal correction circuit according to claim 1, further comprising a halt circuit which stops operation of said phase detector once said logical operator starts producing the output clock signal with the corrected duty cycle.

11. The clock signal correction circuit according to claim 1, wherein:

said edge detector produces a series of detection signals indicating the identified edge position; and said edge detector supplies said delayed signal selector with either even-numbered or odd-numbered signals out of the series of detection signals.

12. A semiconductor device on which a clock signal correction circuit is integrated to correct duty cycle distortions of an input clock signal, the clock signal correction circuit comprising:

a frequency divider which divides the frequency of the input clock signal by a natural number n, thereby producing a divided clock signal;

a phase detector which identifies the phase of the divided clock signal;

a delay unit which produces a delayed divided clock signal by adding a delay to the divided clock signal according to the identified phase of the divided clock signal; and a logical operator which produces an output clock signal by performing a logical operation on the divided clock signal and delayed divided clock signal, wherein said phase detector includes a first delay element array having a plurality of delay elements which produce a first series of delayed signals by adding successively increasing delays to the divided clock signal, and an edge detector which identifies an edge position of the divided clock signal by examining the divided clock signal with reference to the first series of delayed signals produced by said first delay element array;

wherein said delay unit includes a second delay element array having a plurality of delay elements which produces a second series of delayed signals by adding successively increasing delays to the divided clock signal, and a delayed signal selector which selects one of the second series of delayed signals that is associated with the edge position identified by said edge detector, and outputs the selected delayed signal as the delayed divided clock signal; and wherein said phase detector and said delay unit share a common delay element array as the first and second delay element arrays.

* * * * *